United States Patent [19]

Schiltz et al.

[11] Patent Number: 5,300,457
[45] Date of Patent: Apr. 5, 1994

[54] METHOD AND DEVICE FOR THE INSERTION OF CHIPS INTO HOUSINGS IN A SUBSTRATE BY AN INTERMEDIATE FILM

[75] Inventors: Andre Schiltz, Saint Ismier; Louis Thevenot, Meylan; Aime Vareille, Echirolles, all of France

[73] Assignee: France Telecom, Paris, France

[21] Appl. No.: 830,636

[22] Filed: Feb. 4, 1992

[30] Foreign Application Priority Data

Feb. 4, 1991 [FR] France ............................. 91 01232

[51] Int. Cl.⁵ .............................................. H01L 21/60
[52] U.S. Cl. ..................................... 437/209; 437/211; 437/214; 437/217; 437/220
[58] Field of Search ............... 437/209, 211, 214, 215, 437/217, 220

[56] References Cited

U.S. PATENT DOCUMENTS

| | | | |
|---|---|---|---|
| 4,356,374 | 10/1982 | Noyori et al. | 437/215 |
| 4,635,356 | 1/1987 | Ohuchi et al. | 437/209 |
| 4,966,857 | 10/1990 | Haghiri-Tehrani et al. | 437/209 |
| 4,997,791 | 3/1991 | Ohuchi et al. | 437/215 |
| 4,999,077 | 3/1991 | Drake et al. | 437/209 |

*Primary Examiner*—Brian E. Hearn
*Assistant Examiner*—Kevin M. Picardat
*Attorney, Agent, or Firm*—Arnold, White & Durkee

[57] ABSTRACT

Method for the insertion of chips into housings let into a substrate especially of the hybrid type, consisting, before fixing the chips (1a) into the abovementioned housings (2a), in holding the chips (1a) respectively in the abovementioned housings (2a) by the agency of a film (6) which is bonded to one of the faces of the substrate (3) and to which are bonded the chips.

12 Claims, 4 Drawing Sheets

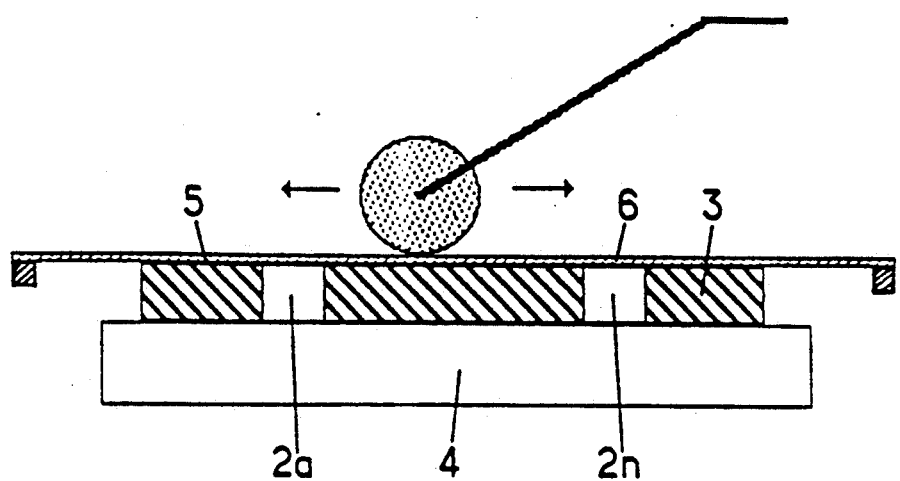
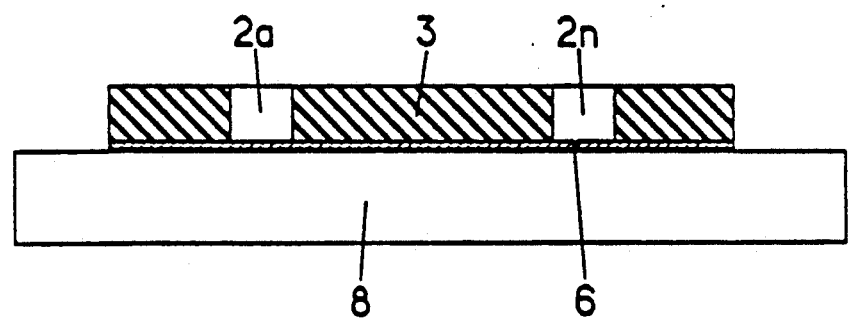
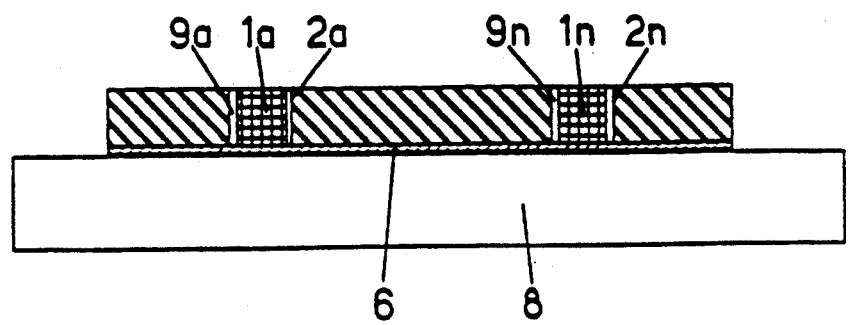

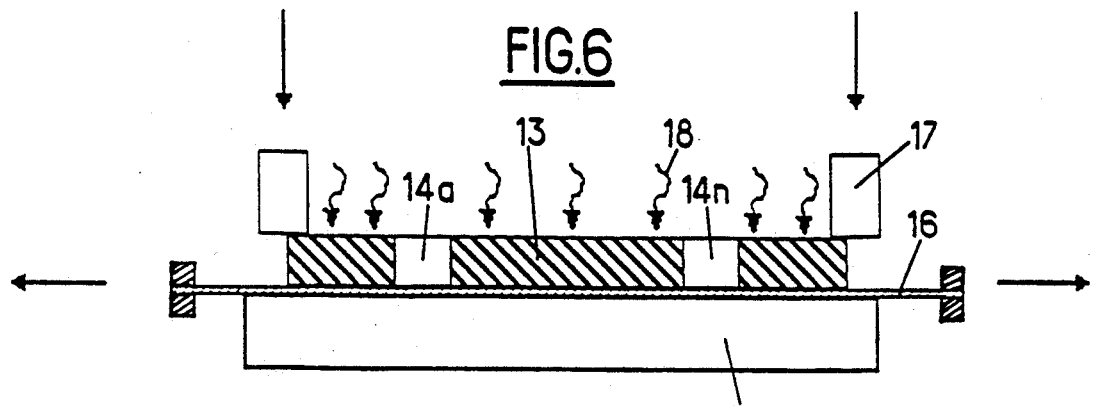
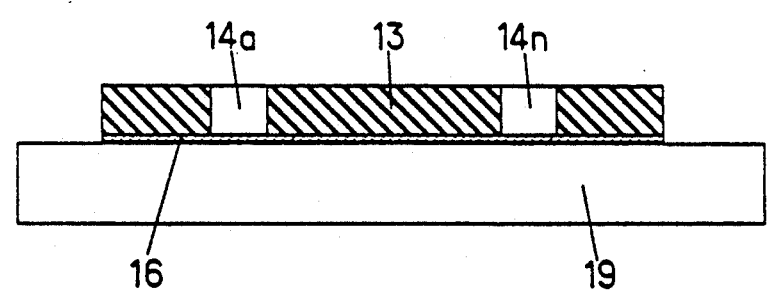
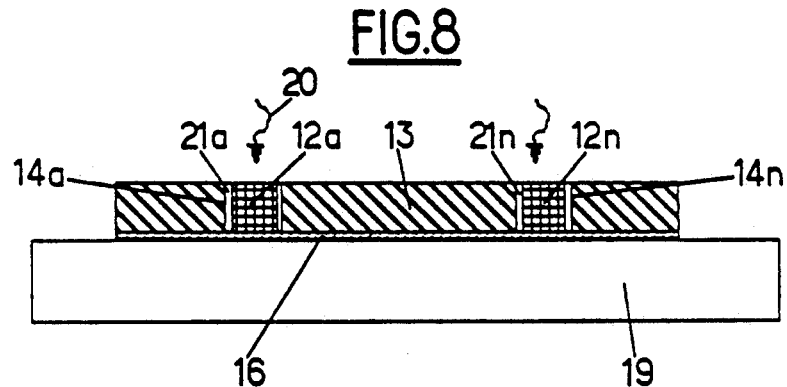
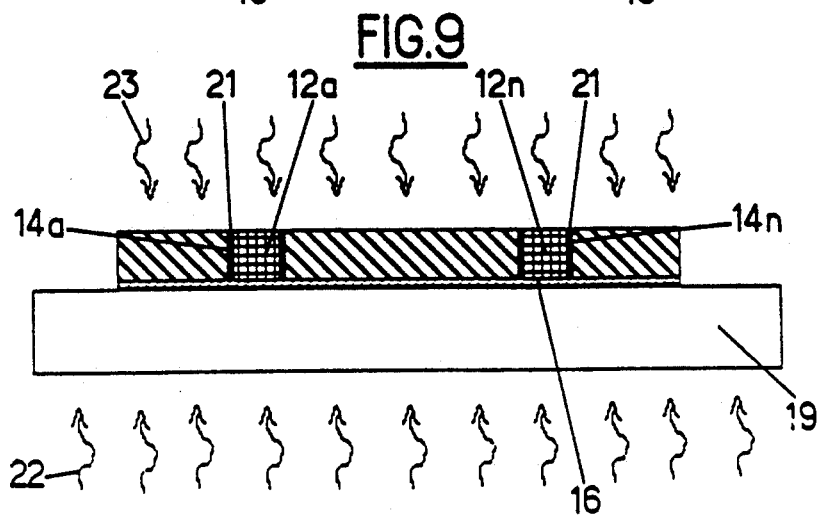

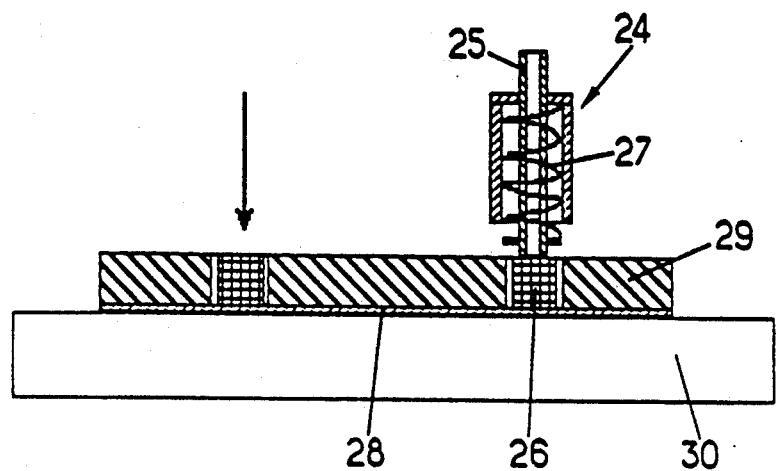
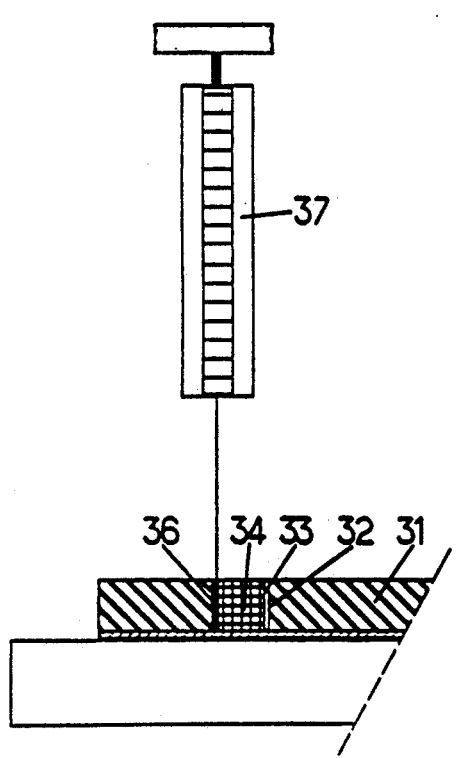
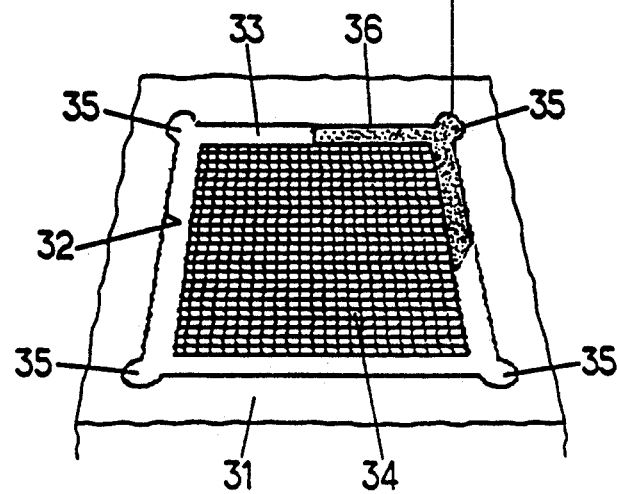

METHOD AND DEVICE FOR THE INSERTION OF CHIPS INTO HOUSINGS IN A SUBSTRATE BY AN INTERMEDIATE FILM

The present invention relates to the mounting of chips on substrates especially of the multi-layer hybrid type and more particularly to the techniques of insertion of one or more chips or components into housings let into a substrate.

The progress achieved in recent years in the field of the design and the production of integrated circuits or chips have permitted considerable miniaturisation of these components. Nowadays, the possibilities for reduction of the size of the chips are limited. Attempts have been made for several years to reduce the distances between associated components in order to miniaturise, not to say transform, conventional printed circuits with a view to the fabrication of what are sometimes called "superchips" which are composed of chips mounted on multi-layer interconnection networks of small dimensions.

In order to effect the mounting of bare chips directly attached onto a substrate, three principal methods are known today.

The first consists in bonding the chip onto the substrate then interconnecting the chip and the network of the substrate by virtue of soldered metallic wires. The drawbacks of this conventional technique of linking by wires are a result of the fragility of the wires and the wire/pad soldering and of the size of such a structure.

The second so-called "flip-chip" technique permits the pads of the chip to be soldered directly to the pads of the substrate, the chip being placed on or bonded to the substrate. The drawbacks of this technique reside on the one hand in the difficulty of aligning, on the wrong side, the pads of the chip and those of the substrate, and on the other hand in the difficulty of carrying out the soldering of the various pads without giving rise to mechanical stresses.

A third technique consists in introducing the bare chips into respective housings fashioned in advance in the substrate, in bonding them and in connecting the pads of the chips to the pads of the substrate by producing electrically conducting surface paths with the aid of microlithography tools.

In a first proposed variant, the substrate which incorporates the interconnection network and the housings intended ultimately for the insertion of the chips is bonded to a second planar substrate.

In a second proposed variant, a planar reference substrate is used onto which is applied a strip of aluminium covered with a mould release agent of the polytetrafluoroethylene type, then each chip is placed in position with the aid of a fastening clip and the adhesive for fixing the chips to the substrate is deposited on the rear face of the latter, the assembly being, after bonding of the chips, released from the mould and the pads of the chips and of the substrate being linked by metallisation.

The drawbacks of the above insertion techniques are the following. In the two proposed variants, the space between the chips and the substrate is relatively wide, which leads to a certain misalignment and to a difficulty in centring the chips in their housing. The sealing adhesive is deposited in an imprecise manner, which leaves a channel on the rear face of the substrate and gives rise to problems of thermal isolation and problems of evenness and of infilling during the stage of lithography of the inter-pad contacts. In the first proposed variant, the additional substrate, which is added in a permanent manner, prevents good thermal dissipation at the rear face of the substrate and of the chips and prevents any later repairs. In the second proposed variant, the necessity of using a fastening clip for each chip to be mounted on a substrate gives rise to such crowding that the mounting of several chips appears troublesome.

The aim of the present invention is to propose a method for the insertion of chips into housings let into a substrate which does not exhibit the drawbacks of the known methods.

According to one object of the invention, the method consists, before fixing the chips into the abovementioned housings, in holding the chips respectively in the abovementioned housings by the agency of a film which is bonded to one of the faces of the substrate and onto which the chips are bonded.

In one preferred embodiment of the invention, the method consists, in a first phase, in bonding the abovementioned intermediate holding film against one of the faces of the substrate and, in a second phase, in engaging respectively in the abovementioned housings the chips and in bonding them against the intermediate holding film.

The method of the invention consists, for preference, before engaging the chips in the housings of the substrate, in placing the latter flat on a planar support in such a way that the abovementioned film extends between them.

The method of the invention consists, for preference, in bonding the intermediate holding film against the front face of the substrate of the hybrid type, the chips being fixed with their front face against this film.

The method of the invention consists in inserting the chips into the housings of the substrate in such a way that a space preferably remains all around the chips.

According to another object of the invention, the method consists, after bonding the chips against the intermediate holding film, in injecting into the space separating the chips from the walls of the housings which receive them a sealing material which, after hardening, holds them fixed to the substrate.

In one variant, the method according to the invention consists in using a self-adhesive film and, after hardening of the sealing material, in peeling off this film.

In another variant, the method of the invention consists in permanently fixing the substrate and the chips onto the intermediate holding film.

The method of the invention can advantageously consist in using a film which bonds by reaction, in locally bonding the latter to the substrate and in locally bonding the chips to this film, for example by heating or ultraviolet radiation.

The method can moreover consist, after insertion of the chips, in bonding by reaction the film over its entire surface, for example by heating or ultraviolet radiation.

According to the invention, the method advantageously consists, after sealing the chips, in effecting the interconnections between the chips and the network of the substrate of the hybrid type by passing through the abovementioned film.

For preference, according to the invention, the method consists in using a fluid sealing material which penetrates into the space between the chips and substrate by capillary action.

The subject of the present invention is also a substrate especially of the hybrid type exhibiting at least one through-housing for insertion of a chip, which housing exhibits straight sides and into the wall of which is let at least one hollow or cutout part.

The subject of the present invention is also a substrate especially of the hybrid type exhibiting at least one through-housing for the insertion of a chip, which housing is dimensioned such that between the peripheral wall of the chip and its own wall there exists an annular space having a thickness of between 20 and 100 microns.

The subject of the present invention is also a device for the insertion of a chip into a through-housing of a substrate especially of the hybrid type, which comprises an insertion head on which the chip is held by suction and which is adapted for holding the chip in the housing under the influence of a defined or monitored force, against a bearing surface, for example the abovementioned film.

BRIEF DESCRIPTION OF DRAWINGS

The present invention will be better understood by studying the methods for the insertion of chips into housings let into a substrate especially of the multilayer hybrid type described by way of non-limiting examples with reference to the drawing in which:

FIGS. 1 to 5 show schematically the stages of a first insertion method according to the invention;

FIGS. 6 to 9 show schematically the stages of a second insertion method according to the invention;

FIG. 10 shows schematically an insertion head;

FIGS. 11 and 12 show a particular means for sealing a chip.

Figure 4:
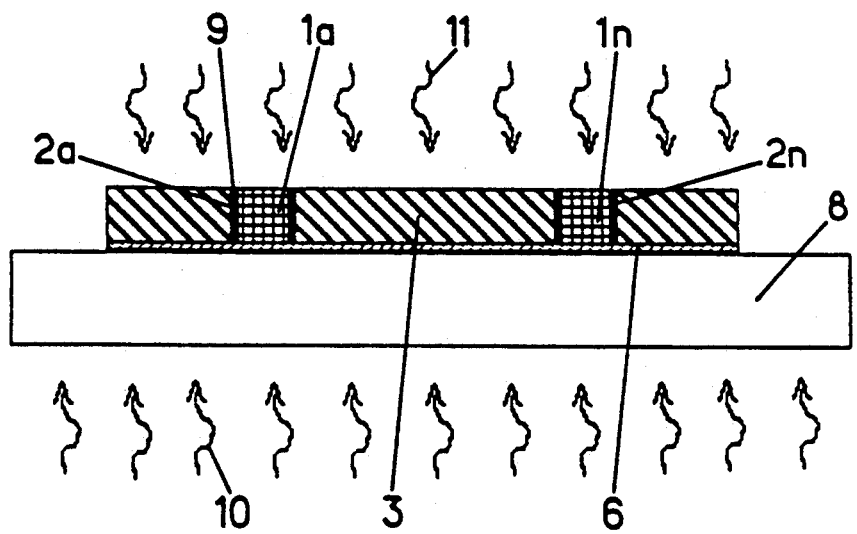

The method illustrated in FIGS. 1 to 5 is intended for the insertion of several chips $1a-1n$ in housings $2a-2n$, respectively, of corresponding shape which are let in through a substrate 3 especially of the multi-layer hybrid type exhibiting the form of a plate.

First of all, as is shown in FIG. 1, the plate 3 is placed on the upper face of a support 4, the front face 5 of the substrate 3 which exhibits the interconnection network being turned upwards. A flexible adhesive film 6 for example made of polyvinyl chloride which is self-adhesive on its lower face is held tight and bonded, applied for example with the aid of a rubber spreading roller 7, to the front face 5 of the substrate 3.

Next, the film 6 is cut out around the substrate 3 and the substrate 3 is placed on a plate 8 in such a way that the film 6 extends between this plate 8 and the substrate 3, this plate 8 being planar and transparent to ultraviolet rays, for preference made of quartz, as is shown in FIG. 2.

In the following stage visible in FIG. 3, the chips $1a-1n$ are engaged in the housings $2a-2n$, respectively, by first of all engaging their front faces equipped with connection pads, until their front faces come into contact with the adhesive film 6 and are thus bonded to this film in a position such that between the peripheral wall of the chips $1a-1n$ and the wall of the housings $2a-2n$ there remain annular spaces $8a-8n$, regular for preference. Thus, the front faces of the chips $1a-1n$ extend in the same plane as the front face of the substrate 3.

In the example represented, the chips $1a-1n$ are of parallelepipedal form and have sides which can have dimensions of between 1 to 10 mm per side and a thickness of between 0.2 and 1 mm. The housings $2a-2n$ are of square or rectangular cross-section of corresponding shape and have straight sides extending perpendicularly to the faces of the substrate 3. The housings $2a-2n$ are dimensioned such that the spaces $9a-9n$ between the chips $1a-1n$ and the wall of the housings $2a-2n$ which receive them are, for preference, between 20 and 100 microns. Moreover, the thickness of the substrate 3 is, for preference, equal to or slightly greater than the thickness of the chips $2a-2n$.

In the subsequent stage represented in FIG. 4, there is introduced into the abovementioned spaces $9a-9n$, by the upper rear face of the substrate 3 opposite the adhesive film 6, a sealing material 9 or adhesive which for preference is very fluid and which by capillary action fills them up, completely, for preference. This sealing material 9 can be a thermally crosslinkable resin filled or otherwise with thermally conducting elements. It may be noted that the sealing material introduced into the spaces $9a-9n$ is retained by the adhesive film 6 and in consequence does not penetrate between the latter and the front faces of the substrate 3 and of the chips $2a-2n$.

The next stage is the simultaneous hardening of the sealing material 9 introduced into the spaces $9a-9n$ for example by a thermal treatment and in particular by photo crosslinking by an ultraviolet 10 radiation emitted onto the front face of the substrate 3 through the support plate 8 and of the adhesive film 6 which are transparent to the ultraviolet rays and/or by an ultraviolet radiation 11 emitted towards the rear face of the substrate 3.

Figure 5:
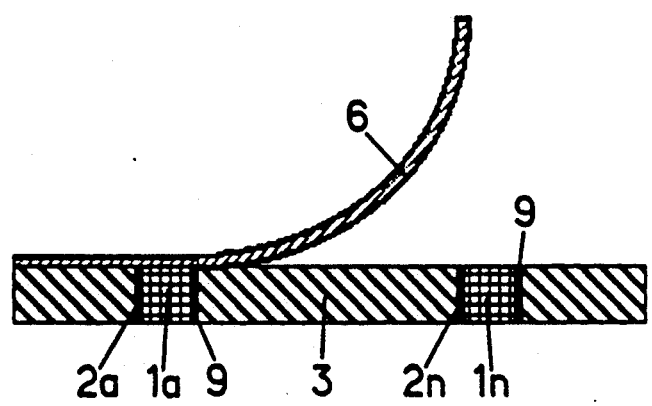

In the following stage represented in FIG. 5, after hardening of the sealing material 9, simultaneously for all of the chips, the adhesive film 6 is next removed by being peeled off. The execution of the electrical connections between the pads of the chips $2a-2n$ and the interconnection network provided on the front face 5 of the substrate 3 can then be carried out.

Referring now to FIGS. 6 to 8, another feature will be described for insertion of chips $12a-12n$ into a substrate 13 into which are let housings $14a-14n$ which are dimensioned as in the preceding example.

In a first stage represented in FIG. 6, a film 16 is extended on a planar support 15 and held firm, this film being for example a non-cyclised polyamide on its upper face or an epoxide which has not been previously crosslinked.

The substrate 13 is placed on the upper face of the film 16 and on this latter pressure is exerted for example by virtue of a pressure frame 17, the front face exhibiting the interconnection network of the substrate 13 being against the film 16.

Thanks to means which have not been represented, an ultraviolet radiation 18 is emitted towards the rear face of the substrate 13, this beam 18 being localised or delimited on the surface in such a way as to transform the material of the film 16 to procure its adhesion onto the front face of the substrate 13 outside the areas corresponding to the housings $14a-14n$.

The film 16 is cut out around the substrate 13 bonded locally onto the front face of the latter and it is placed on the upper face of a planar plate 19 which is transparent to the ultraviolet rays, preferably made of quartz, the film 16 extending between this plate 19 and the substrate 13, as is shown in FIG. 8.

The chips, $12a-12n$ are then engaged, front face first, into the housings $14a-14n$, respectively, of the substrate 13 until they are placed on the film 16 in positions such that, as before, there remain annular spaces $21a-21n$, regular for preference, between the chips $12a-12n$ and the walls of the housings $14a-14n$. A localised ultraviolet radiation 20 is next emitted, which permits the bonding of the chips 12a-12n to the film 16.

Next, as is shown in FIG. 9, sealing material 21 is introduced, as in the example described with reference to FIGS. 1 to 6, into the spaces 21a-21n separating the chips 12a-12n from the walls of the housings 14a-14n of the substrate 13, then the ultraviolet radiation 22 is emitted from below and the ultraviolet radiation 23 from above by virtue of means which have not been represented, over the whole surface of the substrate 13, in such a way as to procure the hardening of the sealing material and in such a way as to regularise the adhesion of the film 16 over the whole front face of the substrate 13 and over the whole front face of the chips 12a-12n.

In this embodiment, the film 16 is intended to remain permanently on the substrate 13. Later, the electrical connections are effected between the pads of the chips 12a-12n and the interconnection network of the substrate 13 through the film 16.

In the examples which are described above, the chips 1a-1n and the chips 12a-12n can be introduced and positioned manually by using, needless to say, a microscope. However, as is shown in FIG. 10, an insertion head can be used, which is designated in a general way by the reference 24 and which comprises a suction tube 25 which makes it possible to hold, at its extremity, a chip 26 to be inserted by suction on its rear face, and which comprises a spring 27 which, by a combination of the effects of this spring 27 and of the vertical movement of the tube 25, permits the chip 26 to be applied with a defined force against the film 28 bonded against one face of the substrate 29 and bearing on the plate 30. Naturally, the insertion head 24 is, for preference, mounted on a moveable transfer and positioning slider and its tube 25 is linked to a source of suction, which are not represented. In the case of the insertion of several chips into the housings of a single substrate, this slider could carry several insertion heads which would then be simultaneously moveable.

Referring now to FIGS. 11 and 12, it is seen that in a substrate 31 there has been provided an insertion housing 32 of rectangular or square cross-section and with straight sides which delimits an annular space 33 between its wall and the peripheral wall of a parallelepipedal chip 34 and that in the four corners of the housing 32 there have been let hollowed or cutout cylindrical parts 35 on the thickness of the substrate through which the liquid sealing material 36 can be easily injected by virtue, for example, of a syringe 37, the sealing material filling the space 33 by capillary action. For preference, the sealing material used exhibits a viscosity of between 10 and 10,000 centipoise.

The present invention is not limited to the examples described above. Many variant embodiments are possible without departing from the scope defined by the attached claims.

We claim:

1. Method for the insertion of chips having a front face equipped with connection pads, into transverse housings formed in a plate substrate, having an interconnection network on a front face, comprising:
    bonding an intermediate adhesive film to the front face of the substrate;
    introducing the chips respectively into the housing;
    holding the chips on the intermediate adhesive film, the front faces of the chips being applied on the intermediate adhesive film, thereby fixing the chips in the housing;
    providing a space between the wall of the housings of the substrate and the chips, said space extending around each chip and having a thickness of from about 20 to 100 microns; and
    injecting in the spaces a fluid sealing material that penetrates into the spaces by capillary action and which, after hardening, holds the chips fixed in the housing of the substrate independently of the intermediate film, said injection occurring after bonding the chips to the intermediate holding film but prior to producing pads-network connections.

2. Method according to claim 1, characterized by the fact that it comprises, in a first phase, in bonding the above-mentioned intermediate holding film against one of the faces of the substrate and, in a second phase, in engaging respectively in the above-mentioned housings the chips and in bonding them against the intermediate holding film.

3. Method according to claim 1, characterized by the fact that it comprises, before engaging the chips in the housings of the substrate, in placing the letter flat on a planar support in such a way that the above-mentioned film extends between them.

4. Method according to claim 1, characterized by the fact that it comprises in inserting the chips into the housings of the substrate in such a way that a space remains all around the chips.

5. Method according to claim 1, characterized by the fact that it comprises in using a self-adhesive film and, after hardening of the sealing material, in peeling off this film.

6. Method according to claim 1, characterized by the fact that it comprises in permanently fixing the substrate and the chips onto the intermediate holding film.

7. Method according to claim 6, characterized by the fact that it comprises in using a film which bonds by reaction, in locally bonding the latter to the substrate and in locally bonding the chips to this film.

8. Method according to claim 7, characterized by the fact that it comprises, after insertion of the chips, in bonding by reaction the entire surface of the film.

9. Method according to claim 6, characterized by the fact that it comprises, after sealing the chips, in effecting the interconnections between the chips and the network of the substrate of the hybrid type by passing through the abovementioned film.

10. Method according to claim 7, characterized by the fact that it comprises, after sealing the chips, in effecting the interconnections between the chips and the network of the substrate of the hybrid type by passing through the abovementioned film.

11. Method according to claim 8, characterized by the fact that it comprises, after sealing the chips, in effecting the interconnections between the chips and the network of the substrate of the hybrid type by passing through the abovementioned film.

12. Method according to claim 11, characterized by the fact that it comprises, during the fixing of the chips into the abovementioned housings, in holding the chips against the film under the influence of a defined or monitored force.

* * * * *

UNITED STATES PATENT AND TRADEMARK OFFICE
CERTIFICATE OF CORRECTION

PATENT NO. : 5,300,457
DATED : April 5, 1994
INVENTOR(S) : Andre Schiltz, Louis Thevenot, Aime Vareille It is certified that error appears in the above-indentified patent and that said Letters Patent is hereby corrected as shown below:

In claim 3, line 25, column 6, delete "letter" and insert --latter--.

In claim 9, column 6, line 50, delete "abovementioned" and insert --above-mentioned--.

In claim 10, column 6, line 55, delete "abovementioned" and insert --above-mentioned--.

In claim 11, column 6, line 60, delete "abovementioned" and insert --above-mentioned--.

In claim 12, column 6, line 63, delete "abovementioned" and insert --above-mentioned--.

Signed and Sealed this

Sixteenth Day of August, 1994

Attest:

BRUCE LEHMAN

*Attesting Officer*  *Commissioner of Patents and Trademarks*